United States Patent [19]

Heeren

[11] 4,221,001
[45] Sep. 2, 1980

[54] SHIFT REGISTER SUITABLE FOR CONTROLLING THE ENERGIZATION OF A MULTIWINDING MOTOR

[75] Inventor: Richard H. Heeren, Palatine, Ill.

[73] Assignee: Teletype Corporation, Skokie, Ill.

[21] Appl. No.: 783,586

[22] Filed: Apr. 1, 1977

[51] Int. Cl.² .............................................. G11C 13/00
[52] U.S. Cl. .................................... 365/78; 307/223 R
[58] Field of Search ................ 365/78, 189, 230, 231; 307/223, 238, 224

[56] References Cited

U.S. PATENT DOCUMENTS 4,138,737  2/1979  McCann ................................. 365/78

Primary Examiner—Terrell W. Fears
Attorney, Agent, or Firm—J. C. Albrecht; W. K. Serp

[57] ABSTRACT

A shift register is described particularly adapted for selectively controlling the energization of the windings of a stepping motor so as to provide selective overlapping phase energization. The shift register consists of four stages each having master and slave sections with each stage controlling the energization of an associated motor winding. A shift register control unit, responsive to stepping and directional signals, directs the shifting of information between the various stages of the shift register. In response to a step high input signal, a high level of one shift register stage is shifted in a selected direction to the adjacent stage with both stages directing the energization of their respective motor windings. Similarly, in response to a step low signal the low levels of the shift register stages are shifted in a selected direction to their adjacent stages causing the deenergization of the respective motor windings. Step high and step low signals are applied simultaneously to cause the output of each shift register stage to shift its level to the adjacent stage in the selected direction.

15 Claims, 5 Drawing Figures

SHIFT REGISTER SUITABLE FOR CONTROLLING THE ENERGIZATION OF A MULTIWINDING MOTOR

BACKGROUND OF THE INVENTION

This invention generally relates to a shift register circuit for selectively shifting high and low level states, and more particularly to a shift register particularly adapted for controlling the energization of the windings of a stepping motor utilizing overlapping phase energization.

Various forms of shift registers are known often catagorized by the manner in which data is loaded into the register, that is, serial or parallel loading. Once data is loaded into the shift register stepping of the data is directed by a directional signal and a clocking signal. The directional signal establishes the direction in which the data moves through the shift register while the clocking signal determines when the data will advance the frequency of the clocking signal establishing the data step rate through the register. In such registers data is stepped, in response to the clocking signal, from one stage to the next adjacent stage. Thus, after each clocking pulse the level of a selected stage is that of its preceding stage prior to the occurrence of the clock pulse. The shift register hereinafter described shifts only selected data levels; that is, in response to an input signal, only a selected data level is transferred to the next adjacent stage as opposed to the transferring of all data levels. For example, in response to a control signal only high level signals will be shifted and correspondingly in response to a second control signal only low level signals will be shifted. The illustrated shift register is particularly adapted for controlling energization of the windings of a stepping motor and it is in this environment that it is described.

Stepping motors are usually operated in one of two modes. A first mode, commonly referred to as single phase operation, is characterized by energizing the motor phase windings sequentially. Stepping is accomplished by successively energizing adjacent windings, progressing in a selected direction, and reversal is accomplished by reversing the direction of phase energization. Alternately, dual phase excitation is utilized to increase torque at a substantial increase in power consumption. In this operational mode, two adjacent phases are energized at all times; one phase continues to produce torque throughout the first half of the following phase excitation.

A third, less frequently encountered, operational mode providing excellent torque characteristics with only slightly increased power requirements, as compared to single phase excitation, is extended phase excitation as described in U.S. Pat. No. 4,093,905 issued June 6, 1978 by L. von Braun entitled "Stepping Motor Using Extended Drive Pulses" and having a common assignee with this application. In this operational mode, the amount of energization overlap between adjacent motor phases is varied to satisfy the torque requirements of the system within which the motor is used. During slow speed operation or during acceleration and deceleration considerable overlap is maintained resulting in improved speed-torque characteristics. Alternatively, when operating at full speed, or under conditions during which power consumption may be maintained at low levels, the overlap is reduced or entirely eliminated and the motor operated in the single phase mode. Full control of such a motor necessitates the ability to reverse direction of the motor; that is, the direction of motor phase energization is reversed.

The illustrated control circuit includes means for varying the amount of phase energization overlap and the rotational direction of a motor in response to three independent control signals from a microprocessor or a programmable logic array such as that described in my U.S. Pat. No. 4,132,979, issued Jan. 2, 1979 and entitled "Method and Apparatus for Controlling A Programmable Logic Array" and having a common assignee with this application.

SUMMARY OF THE INVENTION

In accordance with this invention a shift register has at least three stages. Means are included for placing at least one of the stages in a first state and at least two of the stages in a second state. Means are included for alternately applying first and second control signals to the shift register. A first means is responsive to the first control signal for placing any stage adjacent in a first direction to a stage in the first state in said first state and a second means is responsive to the second control signal for placing any stage adjacent in a first direction to a stage in a second state in said second state.

Additionally, the first means is also responsive to a third signal for placing any stage adjacent in a second direction to a stage in a first state to said first state and similarly the second means is also responsive to the third signal for placing any stage adjacent in a second direction to a stage in a second state in said second state.

Further, each stage of the shift register includes a master storage memory having a read input and an output as well as a slave storage memory having a read input and an output. Means are responsive to the first control signal for placing the slave storage memory adjacent in a first direction to a master storage memory in its first state in said first state and means are responsive to the second control signal for placing the slave storage memory adjacent in a first direction to a master storage memory in its second state in said second state.

The invention includes a method for shifting selected signal levels through a shift register, including the steps of placing at least one of the stages in a first state and at least two of the stages in a second state and alternately applying first and second control signals to the shift register. The invention also includes the step of placing any stage adjacent in a first direction to a stage in a first state in its first state in response to the first control signal as well as placing any stage adjacent in a first direction to a stage in a second state in its second state in response to a second control signal.

DESCRIPTION OF THE ILLUSTRATED EMBODIMENT

General

Figures 1, 3:
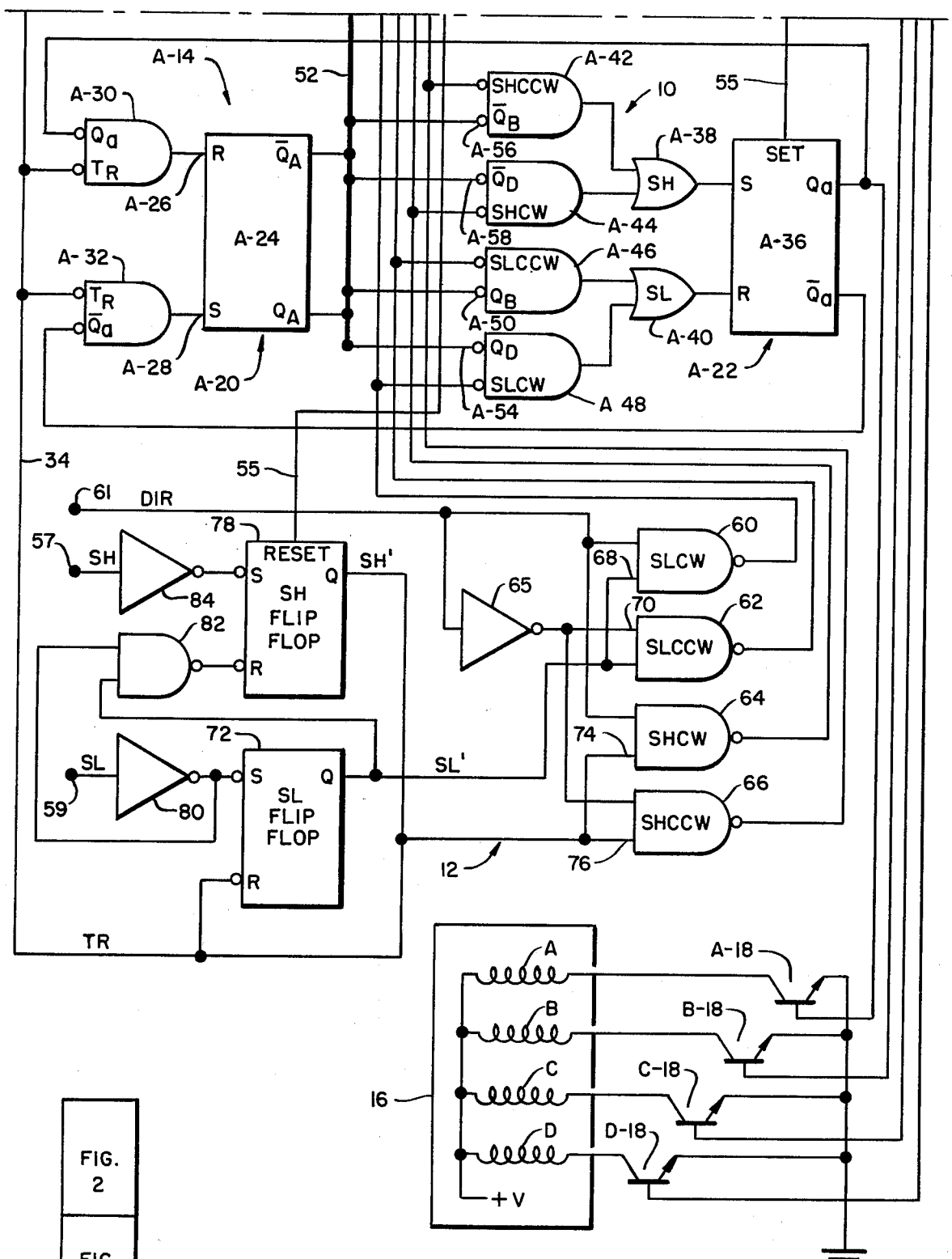
FIG. 1 is a partial diagram of a control circuit particularly adapted for energizing a stepping motor.
FIG. 3 illustrates the combination of FIGS. 1 and 2 to provide a complete diagram of the control circuit.
Figure 2:
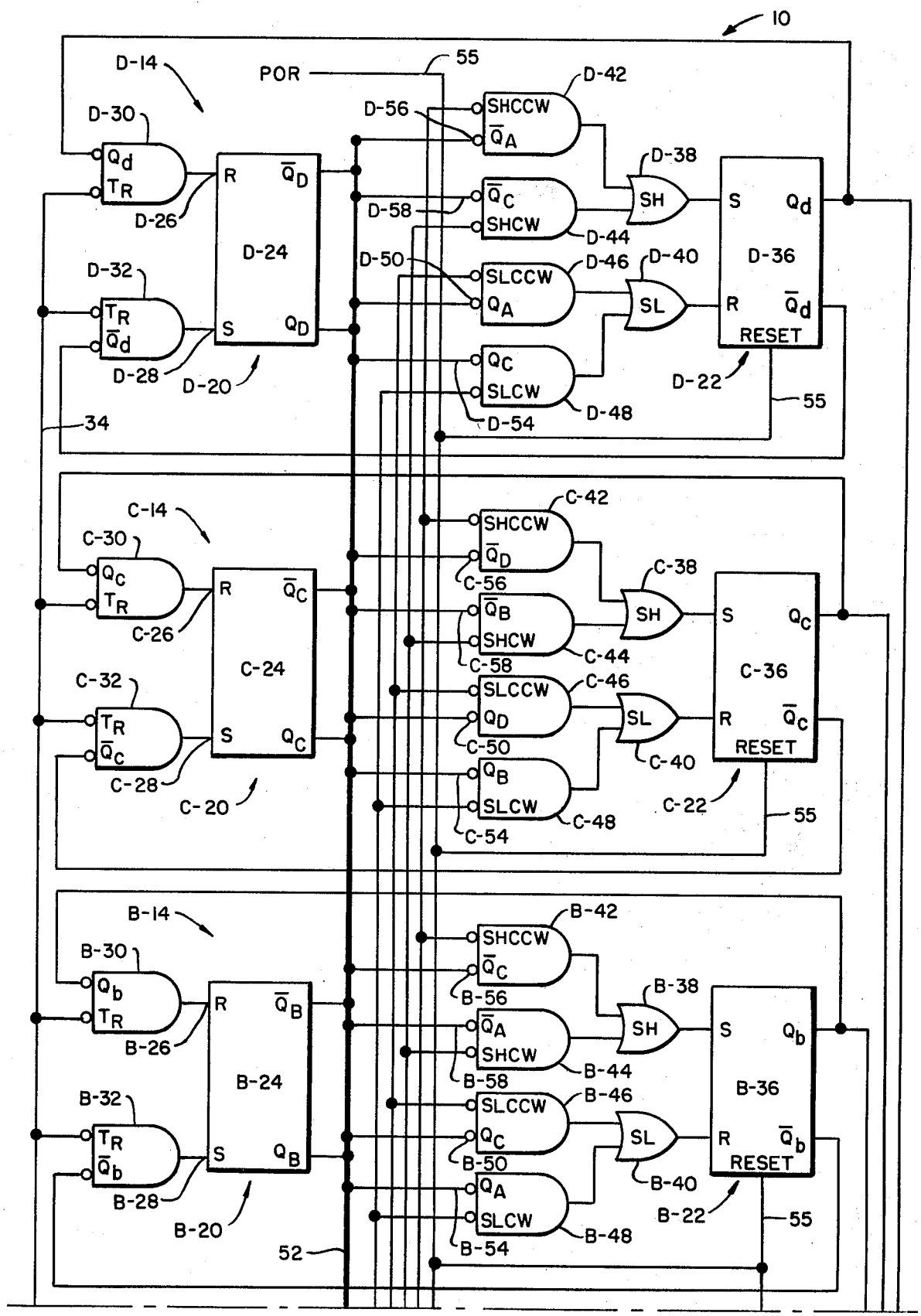
FIG. 2 is another portion of a diagram of a control circuit particularly adapted for energizing a stepping motor.

The control circuit illustrated in FIGS. 1 and 2 (combined as shown in FIG. 3) includes a four stage recirculating shift register 10 and a control unit 12 which serves to control the operation of the shift register 10. Each of the shift register stages A-14, B-14, C-14, and D-14 control the energization of one phase of a four phase motor 16, the motor phase windings being designated A, B, C, and D. As will subsequently be more fully appreciated, additional shift register stages may be included without departing from the scope and spirit of this invention. The motor windings A, B, C, and D are connected to respective NPN switching transistors A-18, B-18, C-18, D-18, each of which is turned ON by a positive voltage applied to its base with respect to the ground end of its associated motor winding. The other ends of the motor windings are connected to a suitable power source (not shown), having an output +V. Each stage of the shift register drives the base of its associated switching transistor, and thus in response to a high input from a selected shift register stage, the selected motor winding is energized.

Shift Register

To facilitate description of the shift register wherein all of the stages A, B, C, D-14 are similar in construction and operation, each stage and the components thereof are referenced with an alphabetical letter corresponding to the motor winding with which the shift register stage to which it is associated followed by an Arabic numeral. Shift register stage A-14 will be described in detail with the components of the other stages referenced with the same numeral preceded by an alphabetical letter corresponding to the motor winding which that shift register stage controls. The shift register stage A-14 may conveniently be visualized as being divided into a master section A-20 and a slave section A-22. The master section A-20 includes a storage memory in the form of an RS flip-flop A-24 having write inputs in the form of reset A-26 and set A-28 inputs which are respectively fed by the outputs of a pair of dual input, active low AND-gates A-30 and A-32. One of the inputs of each of the AND-gates A-30, A-32 is connected to line 34 and controlled by a transfer signal generated by the control unit 12. The remaining input of AND-gate A-30 is connected to the direct output Qa of a storage memory in the form of an RS slave flip-flop A-36 and similarly the remaining input of AND-gate A-32 is connected to the complement output $\overline{Q}a$ of the slave flip-flop A-36. The transfer signal via line 34 serves to load the master flip-flop A-24 with the output of the slave flip-flop A-36.

The slave section A-22 of the shift register stage A-14 includes a dual input, shift high (SH), OR-gate A-38 as well as a dual input shift low (SL), OR-gate A-40. The outputs of the OR-gates A-38, A-40 respectively feed the write inputs in the form of set and reset inputs of the slave flip-flop A-36. One input to the shift high OR-gate A-38 is fed by the output of a dual input, active low, shift high counterclockwise (SHCCW) AND-gate 42 and the remaining input to OR-gate A-38 is fed by the output of a dual input, active low, shift high clockwise (SHCW) AND-gate A-44. Similarly, the "SL" OR-gate A-40 is fed by the outputs of a dual input, active low, shift low counterclockwise (SLCCW) AND-gate A-46 and a dual input, active low, shift low clockwise (SLCW) AND-gate A-48. One input A-50 of the SLCCW AND-gate A-46 is connected to the direct output $Q_B$ of the master flip-flop B-24 of the adjacent stage B-14 via a multiconductor cable 52 and the input A-54 of the SLCW AND-gate A-48 is connected to the direct output $Q_D$ of the other adjacent master flip-flop D-24. Input A-56 of the SHCCW AND-gate A-42 is connected to the complement output $\overline{Q}_B$ of the adjacent shift register stage B-14 master flip-flop B-24 and input A-58 of the SHCW AND-gate A-44 is connected to the complement output $\overline{Q}_D$ of the other adjacent master flip-flop D-24. For purposes of illustrational clarity, the connecting lines between the slave AND-gate inputs 50, 54, 56, and 58 and the master flip-flops 24 are cabled with the signal sources labelled at the AND-gate inputs. One input of each of the slave AND-gates 42, 44, 46, and 48 is controlled by a selected shift signal from the control unit 12 as will be subsequently considered. Additionally, a power ON reset (POR) signal is fed via line 55 to the slave flip-flops 36 resetting flip-flops B, C, D-36, and setting flip-flop A-36. Upon power turn-ON, the shift register 10 is initialized with flip-flop outputs $Q_a$ high and $Q_b$, $Q_c$ and $Q_d$ low.

Control Unit

The shift register control unit 12 serves to generate four control signals namely shift low clockwise (SLCW), shift low counterclockwise (SLCCW), shift high clockwise (SHCW) and shift high counterclockwise (SHCCW). These four output control signals are generated in response to three independent input signals namely a step high (SH), step low (SL), and a motor direction signal (DIR) which determines whether the motor will rotate clockwise (CW) or counterclockwise (CCW). The SH, SL, and DIR signals are supplied at terminals 57, 59, and 61 respectively. In response to a selected combination of input signals SH, SL, and DIR to the control unit 12 a corresponding combination of output signals serves to control the operation of the shift register 10 and thus the energization of the motor 16 coils A, B, C, and D. Serving to drive one input of the SLCW AND-gates A, B, C, D-48 of each shift register section is a shift low clockwise (SLCW) NAND-gate 60. The output of a shift low counterclockwise (SLCCW) NAND-gate 62 feeds one input of the AND-gates A, B, C, D-46. Similarly, a shift high clockwise (SHCW) NAND-gate 64 feeds one input of AND-gates A, B, C, D-44, and a shift high counterclockwise (SLCCW) NAND-gate 66 feeds one input of AND-gates A, B, C, D-42. The incoming DIR signal at input 61 directly feeds one input of the SLCW 60 and SHCW 64 NAND-gates and the input of an inverter 65. The complement DIR output from the inverter 65 is fed to one input of each of the SLCCW 62 and SHCCW 66 NAND-gates. Thus, a high DIR signal will enable the SLCW 60 and SHCW 64 NAND-gates allowing their outputs to follow the level at their alternate inputs and a low DIR level will enable the SLCCW 62 and SHCCW 66 NAND-gates.

Serving to actuate inputs 68 and 70 of the SLCW 60 and SLCCW 62 NAND-gates is the direct output SL' of a step low RS flip-flop 72. Similarly, inputs 74 and 76 of the SHCW 64 and SHCCW 66 NAND-gates are fed by the direct output SH' of a step high RS flip-flop 78. The direct output of the flip-flop 78 is also the transfer signal (TR) which is fed to one input of each of the four shift register stage AND-gates A, B, C, D-30 and A, B, C, D-32 via the line 34. Additionally, the SH' signal feeds the active low, reset input of the SL flip-flop 72 thus assuring that when the SH flip-flop 78 is reset, the SL flip-flop 72 will also be reset. Upon power turn ON, initialization of the flip-flops 72 and 78 in the control circuit is produced by the POR signal which is fed to a second reset input of the flip-flop 78. Upon reset, the flip-flop 78 direct output SH' goes low resetting flip-flop 72.

Setting the active low set input of the SH flip-flop 78 is the output of an inverter 84 the input of which receives the incoming SH control signal at the terminal 57. Serving to set the SL flip-flop 72 is the output of an inverter 80 which feeds the active low, set input of the flip-flop 72. The output of the inverter 80 as well as the direct output of the flip-flop 72 are fed to the two inputs of a dual input NAND-gate 82 the output of which is fed to the active low reset input of the SH flip-flop 78. Thus, in response to the simultaneous presence of two high levels at the inputs of the NAND-gate 82 the SH flip-flop 78 will be reset.

As mentioned, the NAND-gates 60, 62, 64, and 66 of the control unit 12 generate respectively the five shaft register control signals SLCW, SLCCW, SHCW, SHCCW, and the SH flip-flop 78 generates the TR signal. These signals are generated in response to the SH, SL, and DIR signals supplied by a microprocessor, programmable logic array or other similar device and available respectively at input terminals 57, 59, and 61. The frequency and relative time relationship of these three input signals determine the rotational direction, the rotational speed and torque of the motor. As will be more fully appreciated after the following discussion, the DIR signal level determines the rotational direction of the motor while the frequency rate of the SH signal sets the rotational speed of the motor. Further, the amount of delay between the occurrence of an SL signal after the preceding SH signal controls the amount of energization overlap of the windings and thus the torque characteristics of the motor 16.

Clockwise Operation

Figure 4:
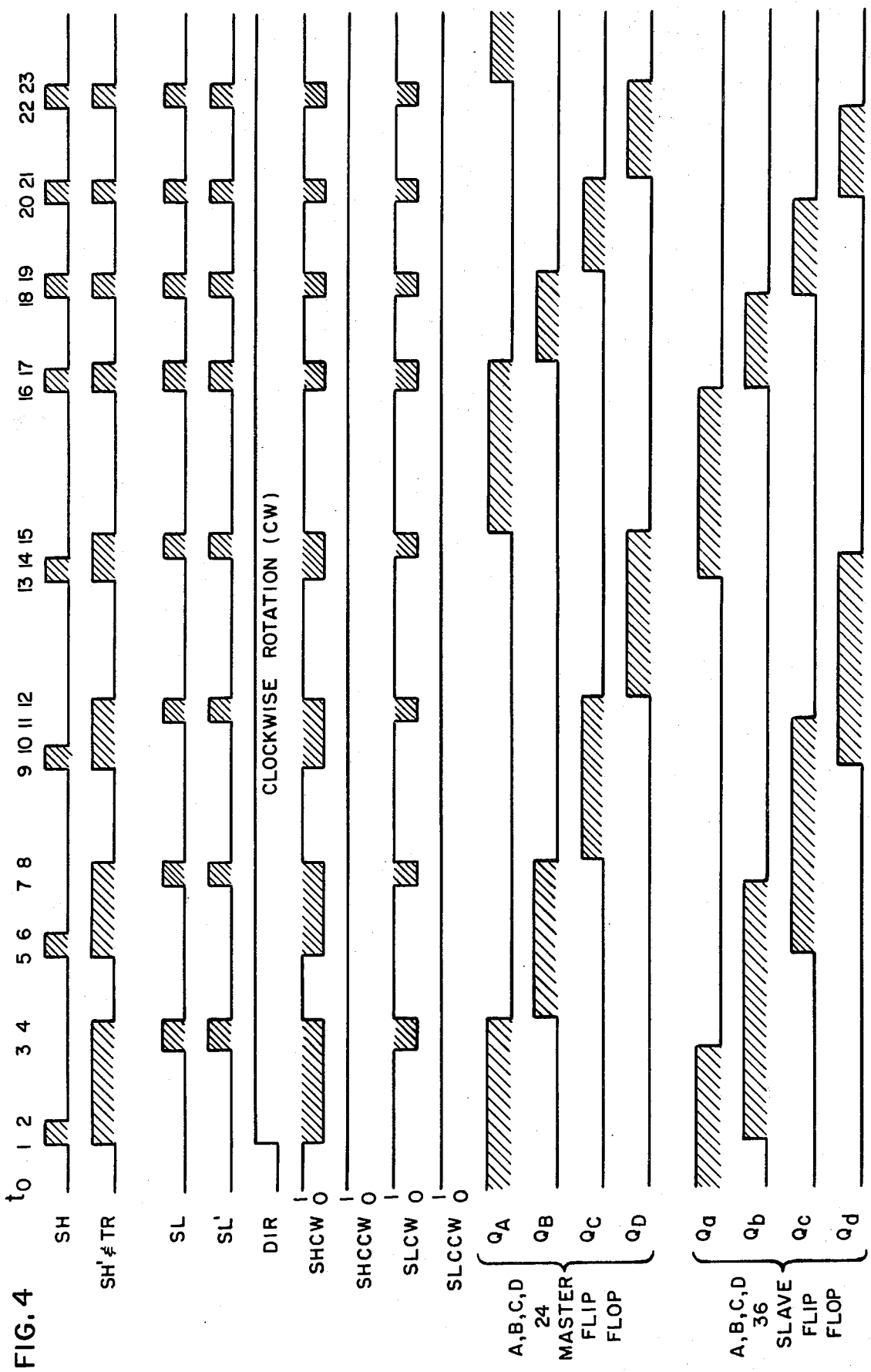
FIG. 4 is a timing diagram of the apparatus of FIG. 3 in a first operating condition.

With reference to FIG. 4, selected signal levels are shown illustrating the operation of the shift register 10 and control circuit 12 when energizing the motor 16 for operation in a clockwise direction. During time period $t_1$ to $t_{16}$ the motor 16 is accelerating in speed with the winding phase energization overlapping by a gradually decreasing amount thus reducing motor torque and power consumption as operating speed is attained. It will be appreciated that the time interval $t_1-t_{16}$ during which the motor accelerates from rest has been compressed for purposes of illustration and that generally a greater time interval will occur during acceleration and thus a more gradual decrease in the energization overlap of the motor windings will normally be experienced. From time period $t_{16}$ through $t_{23}$ the motor 16 is operated in a single phase mode, that is with non-overlapping phase winding energization.

At time $t_0$ power is supplied to the circuit 10 with the POR signal resetting the slave flip-flops B, C, D-36 and setting the slave flip-flop A-36. Additionally, the POR signal resets the SH flip-flop 78. The low TR signal at the direct output Q of SH flip-flop 78, generated in response to the POR signal, causes the master flip-flops A, B, C, D-24 to load with the outputs of their respective slave flip-flops A, B, C, D-36. Thus, initially the direct outputs of master flip-flop A-36 and slave flip-flop A-24 are high with the remaining slave B, C, D-36 and master B, C, D-24 flip-flop direct outputs low. At $t_1$ an incoming DIR signal at input 61 goes high which establishes the clockwise operational mode and remains high throughout the time period $t_1-t_{23}$. The incoming SH signal at input 57 is high between times $t_1$ and $t_2$ as well as the subsequent time periods $t_5-t_6$, and $t_9-t_{10}$, etc. As will subsequently be more fully appreciated, the repetition rate of the SH pulse determines the speed of rotation of the motor 16 and, as illustrated, during time period $t_{16}-t_{23}$ the rotational speed of the motor is greater than during the preceding time interval.

In response to the SH pulse at time $t_1$, the direct output signals SH' and TR of the SH flip-flop 78 goes high. Signals SH'-TR enable one input of the SHCW 64 and SHCCW 66 NAND-gates as well as disables one input of the master AND-gates A, B, C, D-30 and 32. The high DIR signal and the SH' signal at the SHCW NAND-gate 64 inputs produces a low at the output of this gate. This low level appears at the SHCW inputs of the slave AND-gates A, B, C, D-44. The remaining input to the AND-gate A-44 is fed by the complement output $\overline{Q}_D$ of the master flip-flop D-24 which is high and therefore the state of flip-flop A-36 is unchanged. With respect to stage B-14, the alternate input to AND-gate B-44 is fed by the complement output $\overline{Q}_A$ of master flip-flop A-24 which is low. The low levels at both of the active low inputs of the AND-gate B-44 produces a high output signal which is coupled through OR-gate B-38 setting flip-flop B-36 with the direct output $Q_B$ going high. Shift register stages C-14 and D-14 operate in a similar manner and since the complement outputs $\overline{Q}_B$ and $\overline{Q}_C$ of the master flip-flops B-24, C-24 are high at $t_1$, the outputs of the AND-gates C-24, D-24 remain low and the initial states of slave flip-flops C-36, D-36 remain. Thus, the direct output $Q_A$ of flip-flop A-36 remains high with the direct output $Q_B$ of slave flip-flop B-36 going high at $t_1$. That is, the shift register has shifted only highs clockwise in response to a shift high pulse. When reference is made to the shifting of signal levels between adjacent shift register stages, the level shifted is also exhibited by the initial stage after shifting has occurred so that, after shifting, adjacent stages will exhibit the same logic level. As previously described, the direct outputs of the slave flip-flops A, B, C, D-36 are fed to the control transistors A, B, C, D-18 and at $t_1$ both windings A and B are energized providing overlapping phase energization of the motor 16.

At time $t_3$ an SL pulse is introduced at input 59 and in response the SL flip-flop 72 direct output SL' goes high. This high SL' signal is fed to one input of the SLCW NAND-gate 60 and in combination with a high DIR signal at the alternate input the output goes low. The low SLCW signal from NAND-gate 60 is fed to AND-gate A-48 and thus the low level of the direct output $Q_D$ of the master flip-flop D-24 is fed through the SL OR-gate A-40 resetting the slave flip-flop A-36 in response to which $Q_a$ of flip-flop A-36 goes low deenergizing phase A of the motor 16 at time $t_3$. Thus, in response to an incoming SL signal only the low output of the shift register stages have shifted to the adjacent clockwise stage. Similarly at time $t_3$ one input of AND-gate B-48 receives a high input from the direct output $Q_A$ of the master flip-flop A-34 and therefore the state of flip-flop B-36 remains unchanged. Similarly, the direct outputs of the slave flip-flops C, D-36 do not change state.

At time $t_4$ the SL pulse is terminated with SL' going high. At $t_4$ both inputs to the NAND-gate 82 are high with the output of the gate going low and resetting the flip-flop 78. Reset of the flip-flop 78 brings SH' and TR low as illustrated in FIG. 4. In response to the low level of the TR signal at the inputs to the master NAND-gates A, B, C, D-30 and 32, the master flip-flops A, B, C, D-24 follow the outputs of their respective slave flip-flops A, B, C, D-36, with the direct output $Q_A$ of flip-flop A-24 going low and the direct output $Q_B$ of flip-flop B-24 going high. From time $t_0$ through $t_{16}$ the SH and SL signals alternate with the delay between the SL signal and the preceding SH signal decreasing. As the motor reaches speed with decreasing torque requirements the energization overlap of adjacent motor phases decreases. From time $t_{16}$ to $t_{23}$ the SH and SL pulses are synchronized fully eliminating winding energization overlap.

Counterclockwise Operation

Figure 5:
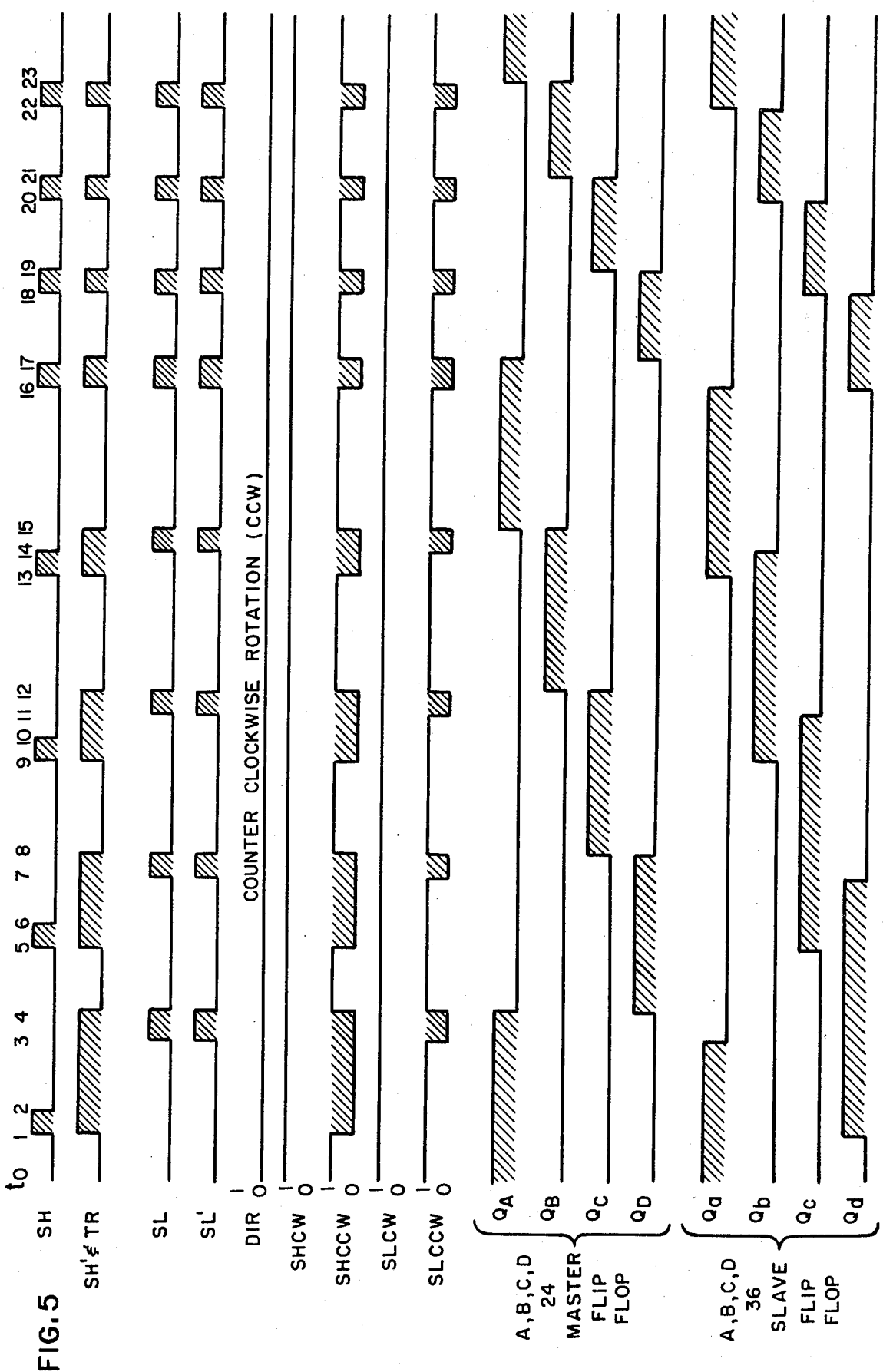
FIG. 5 is a timing diagram of the apparatus of FIG. 3 in an alternate operating condition.

FIG. 5 illustrates various signal levels of the control circuit of FIG. 3 during counterclockwise rotation of the motor 16. At time $t_0$ the POR signal is applied to conductor 55 resetting the control circuit to its initialized state. In this state, the direct outputs of the master A-24 and slave A-36 flip-flops are high. Additionally, the DIR signal is low selecting a counterclockwise motor 16 rotation. At time $t_1$ an incoming SH pulse a terminal 57 brings the output from the SHCCW NAND-gate 66 low. The direct output of the slave flip-flop D-36 goes high following the complement output $Q_A$ of the master flip-flop A-24. At time $t_3$, the output of the SLCCW NAND-gate 62 goes low and the direct output $Q_A$ of the slave flip-flop A-36 goes low following the level of the direct output $Q_B$ of master flip-flop B-24. Thus, the occurrence of a low SL pulse shifts all low levels of the stages A, B, C, D-14 counterclockwise and terminates the winding energization overlap. In response to a low SL level the direct output Q of flip-flop 78 goes low, causing each of the master flip-flops A, B, C, D-24 to load with the outputs of their corresponding slave flip-flops A, B, C, D-36. As discussed in connection with the clockwise rotation of FIG. 4, the motor rotational speed is determined by the frequency rate of the SH signal and the amount of overlap controlled by the delay between the occurrence of an SH pulse and the following SL pulse. At time $t_{16}$ the motor has reached its operating speed and both the SH and SL pulses are in synchronization. Thereafter, the motor is run at a somewhat increased speed.

A shift register has been described which is particularly adapted for controlling the phases of a multi-winding motor. In response to three input signals SH, SL, and DIR, the direction of the motor 16 is determined as well as its speed and torque. Although this invention has been particularly shown and described with reference to a preferred embodiment thereof, it will be understood that various changes in form and detail may be made without departing from the spirit and scope of the invention as set forth in the following claims.

What is claimed:

1. A shift register having at least three stages, each of the stages having first and second stable states, which comprises:
means for placing at least one of said stages in the first state and at least two of said stages in the second state;
means for alternately applying first and second control signals to said shift register;
first means responsive to said first signal for placing any stage adjacent in a first direction to a stage in the first state in said first state; and
second means responsive to said second signal for placing any stage adjacent in a first direction to a stage in the second state in said second state.

2. The shift register of claim 1 further comprising means for applying a third directional signal and wherein said first means includes means responsive to said third signal for placing any stage adjacent in a second direction to a stage in said first state in said first state.

3. The shift register of claim 2 wherein said second means includes means responsive to said third signal for placing any stage adjacent in a second direction to a stage in said second state in said second state.

4. The shift register of claim 1 wherein said shift register has the output of each stage selectively controlling the input of the next successive stage to effect recirculation in a first direction.

5. The shift register of claim 3 wherein said shift register has the output of each stage selectively controlling the input of the next successive stage to effect recirculation of data therein in a second direction.

6. A method for shifting binary signals through a shift register, the shift register having at least three stages each of which has either a first state or a second state, comprising the steps of:
placing at least one of said stages in its first state and at least one of said stages in its second state;
alternately applying first and second control signals to said shift register;
placing, in response to said first control signal, any stage adjacent, in a first direction, to a stage in a first state, in said first state; and
placing, in response to said second control signal, any stage adjacent, in a first direction, to a stage in a second state, in said second stage.

7. The method of claim 6 which further includes the steps of: changing said first direction to a second direction in response to a directional signal.

8. A shift register having at least three stages wherein each stage comprises:
a master storage memory having a read input and an output,
a slave storage memory having a read input and an output,
means fo initializing the stages of said shift register so that at least the slave and master storage memories of one stage are in a first state and the slave and master storage memories of still another stage are in a second state; and
means, responsive to a first control signal, for placing the slave storage memory adjacent in a first direction to a master storage memory in its first state in said first state.

9. The shift register of claim 8 which further includes means, responsive to a second control signal, for placing the slave storage memory adjacent in a first direction to a master storage memory in its second state in said second state.

10. The shift register of claim 9 which further includes means responsive to said second control signal for loading said master storage memories with the outputs of their associated slave storage memories so that both the master and slave storage memories of each of the shift register stages will be in the same state.

11. The shift register of claim 10 which further includes means responsive to a direction signal for placing the slave storage memory in the stage adjacent in a second direction to the stage having its master storage memory in said first state to said first state, in response to said first control signal.

12. The shift register of claim 11 wherein said direction signal means serves to place the slave storage memory of the stage adjacent in a second direction to the stage having its master storage memory in a said second state, to said second state in response to said second control signal.

13. The shift register of claim 12 wherein said master storage memories are master flip-flop logic units, said slave storage memories are slave flip-flop logic units and said loading means comprises a gating means associated with each master flip-flop unit with one input of each gating means being fed by the output of the associated slave flip-flop and another input being fed by said second control signal, the output of said gating means controlling said master flip-flop.

14. The shift register of claim 13 wherein said first control signal responsive means includes second gating means, one input of said second gating means receives said first control signal and still another input of said second gating means receives said direction signal, the output of said second gating means serving to direct the shifting of said first state from said first master flip-flop to an adjacent stage slave flip-flop.

15. The shift register of claim 14 wherein said second control signal responsive means includes third gating means, one input of said third gating means receives said second control signal and another input of said third gating means receives said direction signal, the output of said third gating means serving to direct the shifting of said second level from said master flip-flop at said second level to an adjacent stage slave flip-flop.

* * * * *